(12) United States Patent
Raghavan

(10) Patent No.: US 12,464,808 B2
(45) Date of Patent: Nov. 4, 2025

(54) DUMMY CELL DESIGNS FOR NANOSHEET DEVICES

(71) Applicant: Apple Inc., Cupertino, CA (US)

(72) Inventor: Praveen Raghavan, Cupertino, CA (US)

(73) Assignee: Apple Inc., Cupertino, CA (US)

(*) Notice: Subject to any disclaimer, the term of this patent is extended or adjusted under 35 U.S.C. 154(b) by 0 days.

(21) Appl. No.: 18/524,529

(22) Filed: Nov. 30, 2023

(65) Prior Publication Data
US 2025/0113593 A1    Apr. 3, 2025

Related U.S. Application Data

(60) Provisional application No. 63/586,146, filed on Sep. 28, 2023.

(51) Int. Cl.
| | |
|---|---|
| *H10D 84/83* | (2025.01) |
| *H10D 30/43* | (2025.01) |
| *H10D 30/67* | (2025.01) |
| *H10D 62/10* | (2025.01) |
| *H10D 64/01* | (2025.01) |
| *H10D 84/01* | (2025.01) |

(Continued)

(52) U.S. Cl.
CPC .............. *H10D 84/83* (2025.01); *H10D 30/43* (2025.01); *H10D 30/6735* (2025.01); *H10D 30/6757* (2025.01); *H10D 62/121* (2025.01); *H10D 89/00* (2025.01)

(58) Field of Classification Search
CPC .... H10D 84/83; H10D 30/43; H10D 30/6735; H10D 30/6757; H10D 62/121; H10D 89/00

USPC ........................................................ 257/401
See application file for complete search history.

(56) References Cited

U.S. PATENT DOCUMENTS

| | | |
|---|---|---|
| 9,634,092 B2 | 4/2017 | Bhuwalka et al. |
| 10,923,474 B2 | 2/2021 | Liaw |

(Continued)

FOREIGN PATENT DOCUMENTS

| | | |
|---|---|---|
| KR | 10-2021-0139132 A | 11/2021 |
| KR | 10-2022-0060974 A | 5/2022 |

(Continued)

OTHER PUBLICATIONS

International Search Report and Written Opinion in PCT Appl. No. PCT/US2024/044530 mailed Dec. 9, 2024, 9 pages.

*Primary Examiner* — Tong-Ho Kim
(74) *Attorney, Agent, or Firm* — Kowert, Hood, Munyon, Rankin & Goetzel, P.C.; Gareth M. Sampson; Dean M. Munyon

(57) ABSTRACT

Various integrated circuit transistor device structures that implement nanosheet fin transistors are disclosed. Layouts for the transistor device structures include active cells with dummy cells positioned between active cells. The active cells and dummy cells may include nanosheet fin regions that have different widths. In certain instances, the transitions between different nanosheet fin regions widths (e.g., jogs in the widths) are positioned inside the dummy cells rather than at interfaces between the dummy cells and the active cells. Placing the jogs in widths inside the dummy cells reduces mechanical stresses between active cells and dummy cells and allows for design changes in the size of active transistors during a manufacturing process.

20 Claims, 6 Drawing Sheets

(51) Int. Cl.
    *H10D 84/03*     (2025.01)
    *H10D 89/00*     (2025.01)
    *H10D 89/10*     (2025.01)

(56) References Cited

U.S. PATENT DOCUMENTS

| | | |
|---|---|---|
| 11,222,158 B2 | 1/2022 | Chae et al. |
| 11,393,815 B2 | 7/2022 | Lin et al. |
| 11,569,231 B2 | 1/2023 | Snyder et al. |
| 2020/0105752 A1* | 4/2020 | Liaw .................. H10D 30/6757 |
| 2020/0287046 A1 | 9/2020 | Frougier et al. |
| 2021/0226070 A1 | 7/2021 | Liaw |
| 2022/0005802 A1 | 1/2022 | Tung |
| 2023/0237235 A1 | 7/2023 | Verma et al. |
| 2023/0378156 A1 | 11/2023 | You et al. |
| 2024/0120378 A1* | 4/2024 | Lim .................... H10D 84/038 |

FOREIGN PATENT DOCUMENTS

| | | |
|---|---|---|
| KR | 10-2023-0115861 A | 8/2023 |
| KR | 10-2024-0015582 A | 2/2024 |

\* cited by examiner

DUMMY CELL DESIGNS FOR NANOSHEET DEVICES

PRIORITY CLAIM

The present application claims priority to U.S. Provisional App. No. 63/586,146, entitled "Dummy Cell Designs for Nanosheet Devices," filed Sep. 28, 2023, the disclosure of which is incorporated by reference herein in its entirety.

BACKGROUND

Technical Field

Embodiments described herein relate to transistor structures for semiconductor devices. More particularly, embodiments described herein relate to structures and designs for integrated circuit devices with active and inactive nanosheet transistors.

Description of the Related Art

Nanosheet (e.g., gate-all-around) transistors are increasingly being utilized in integrated circuits. Nanosheet transistors may have more effective characteristics for turning on/off the transistors versus planar FETs or FinFETs due to the increase in gate control of the channel provided by the geometry of the nanosheet transistor design. The increased effectiveness in turning the transistors on or off may provide leakage reduction and better power utilization (e.g., voltage reduction) for integrated circuits utilizing nanosheet transistors. Nanosheet transistors may have a more complex design than planar FETs or FinFETs. As the design of integrated circuits evolves, more avenues for utilization of the more complex design of nanosheet transistors may be contemplated.

BRIEF DESCRIPTION OF THE DRAWINGS

Features and advantages of the methods and apparatus of the embodiments described in this disclosure will be more fully appreciated by reference to the following detailed description of presently preferred but nonetheless illustrative embodiments in accordance with the embodiments described in this disclosure when taken in conjunction with the accompanying drawings in which.

Figure 1:
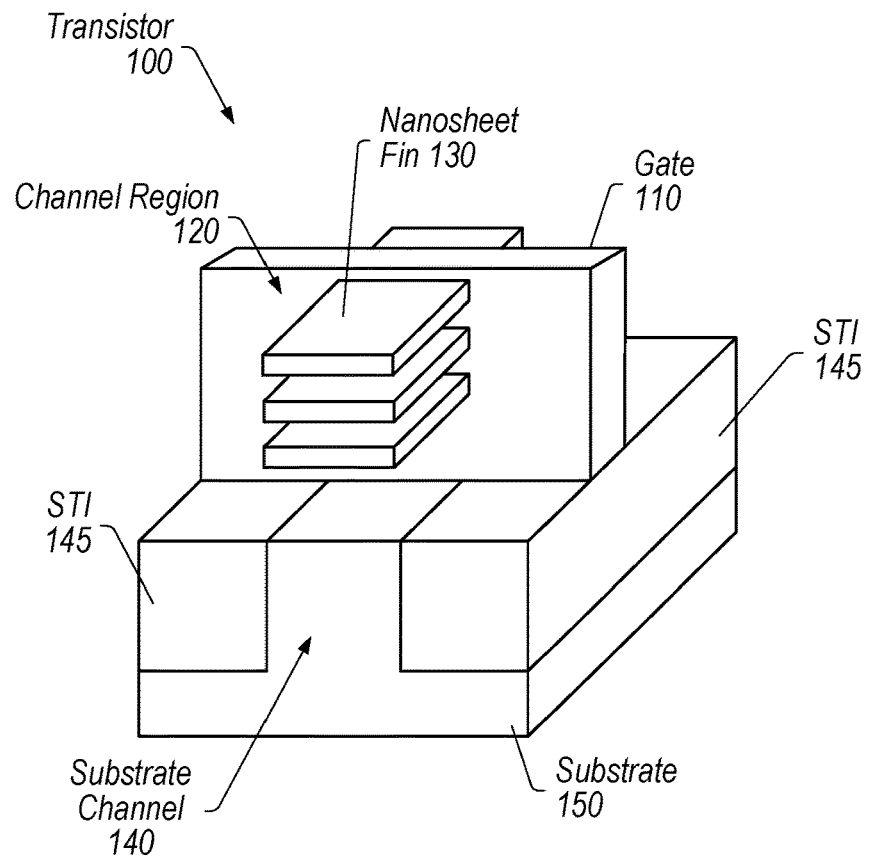
FIG. 1 depicts a perspective representation of a nanosheet transistor, according to some embodiments.

Although the embodiments disclosed herein are susceptible to various modifications and alternative forms, specific embodiments are shown by way of example in the drawings and are described herein in detail. It should be understood, however, that drawings and detailed description thereto are not intended to limit the scope of the claims to the particular forms disclosed. On the contrary, this application is intended to cover all modifications, equivalents and alternatives falling within the spirit and scope of the disclosure of the present application as defined by the appended claims.

DETAILED DESCRIPTION OF EMBODIMENTS

As used herein, the term "standard cell" refers to a group of transistor structures, passive structures, and interconnect structures formed on a substrate to provide logic or storage functions that are standard for a variety of implementations. For example, an individual standard cell may be one cell in a library of multiple cells from which various suitable cells may be selected to implement a specific cell design. As further example, a standard cell may be a cell design that is created (e.g., designed) and then the cell design is implemented multiple times for generating integrated circuit devices via, for instance, synthesis or automated flows. Integrated circuit cells may also include custom circuit design cells that are individually designed for a particular implementation. Embodiments of circuit design cells described herein may be implemented in various implementations of logic integrated circuits or memory integrated circuits.

FIG. 1 depicts a perspective representation of a nanosheet transistor, according to some embodiments. In the illustrated embodiment, nanosheet transistor 100 is formed on substrate 150. In certain embodiments, transistor 100 includes gate 110 and channel region 120. Gate 110 may be a polysilicon gate or a metal gate. Channel region 120 includes nanosheet fins 130 and substrate channel 140. Nanosheet fins 130 are fins made of silicon, another semiconductor, or a combination of semiconductors that pass through the structure (e.g., the material) of gate 110. In various embodiments, nanosheet fins 130 are relatively thin (in the vertical dimension), rectangular regions (e.g., sheets) of semiconductor material that are aligned parallel to substrate 150 (e.g., the horizontal planes of nanosheet fins 130 are parallel to the horizontal plane of substrate 150). Transistor 100 typically includes multiple nanosheet fins 130 passing through gate 110. For instance, as shown in FIG. 1, transistor 100 includes three nanosheet fins 130 passing through gate 110.

In various embodiments, substrate channel 140 is formed in substrate 150 below nanosheet fins 130. Substrate channel 140 may be formed by forming shallow trench isolations (STIs) 145 on either side of the substrate channel in substrate 150. Thus, substrate channel 140 is a portion of substrate 150 between STIs 145. In certain embodiments, substrate channel 140 is aligned with and has similar horizontal dimensions (e.g., length or width) as nanosheet fins 130. In some embodiments, substrate channel 140 is made of the same semiconductor material as nanosheet fins 130. For instance, both nanosheet fins 130 and substrate channel 140 may be silicon.

Figure 2:
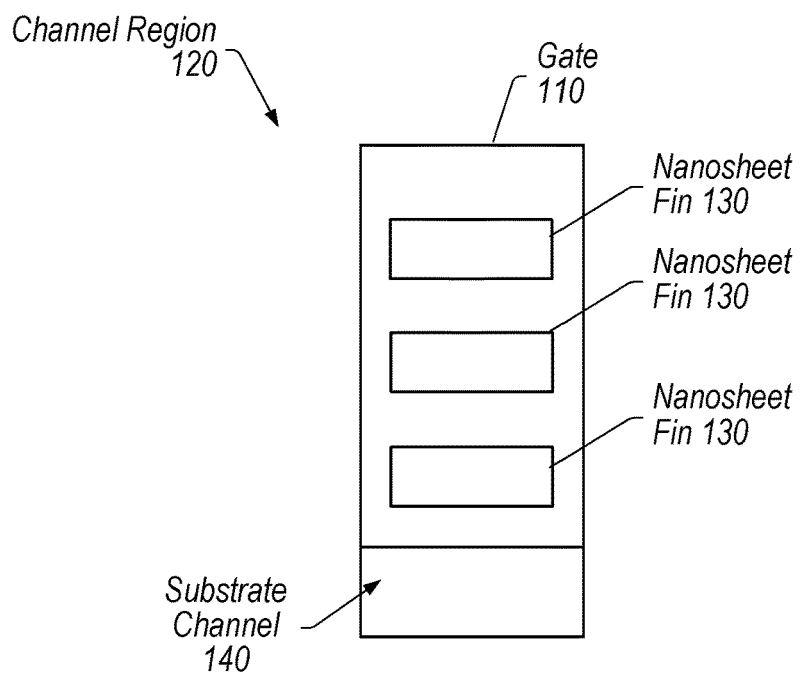
FIG. 2 depicts an end-view representation of a channel region, according to some embodiments.

FIG. 2 depicts an end-view representation of channel region 120, according to some embodiments. In the illustrated embodiment, channel region 120 includes nanosheet fins 130 inside gate 110 above substrate channel 140. In certain embodiments, gate 110 substantially surrounds (e.g., is "all-around") nanosheet fins 130. It should be noted there may be at least some gate dielectric material (not shown) between nanosheet fins 130 and gate 110. Surrounding nanosheet fins 130 with gate 110 provides better control over operation of the gate and reduces current leakage from the gate to produce more effective characteristics for turning the gate on and off.

Figure 3:
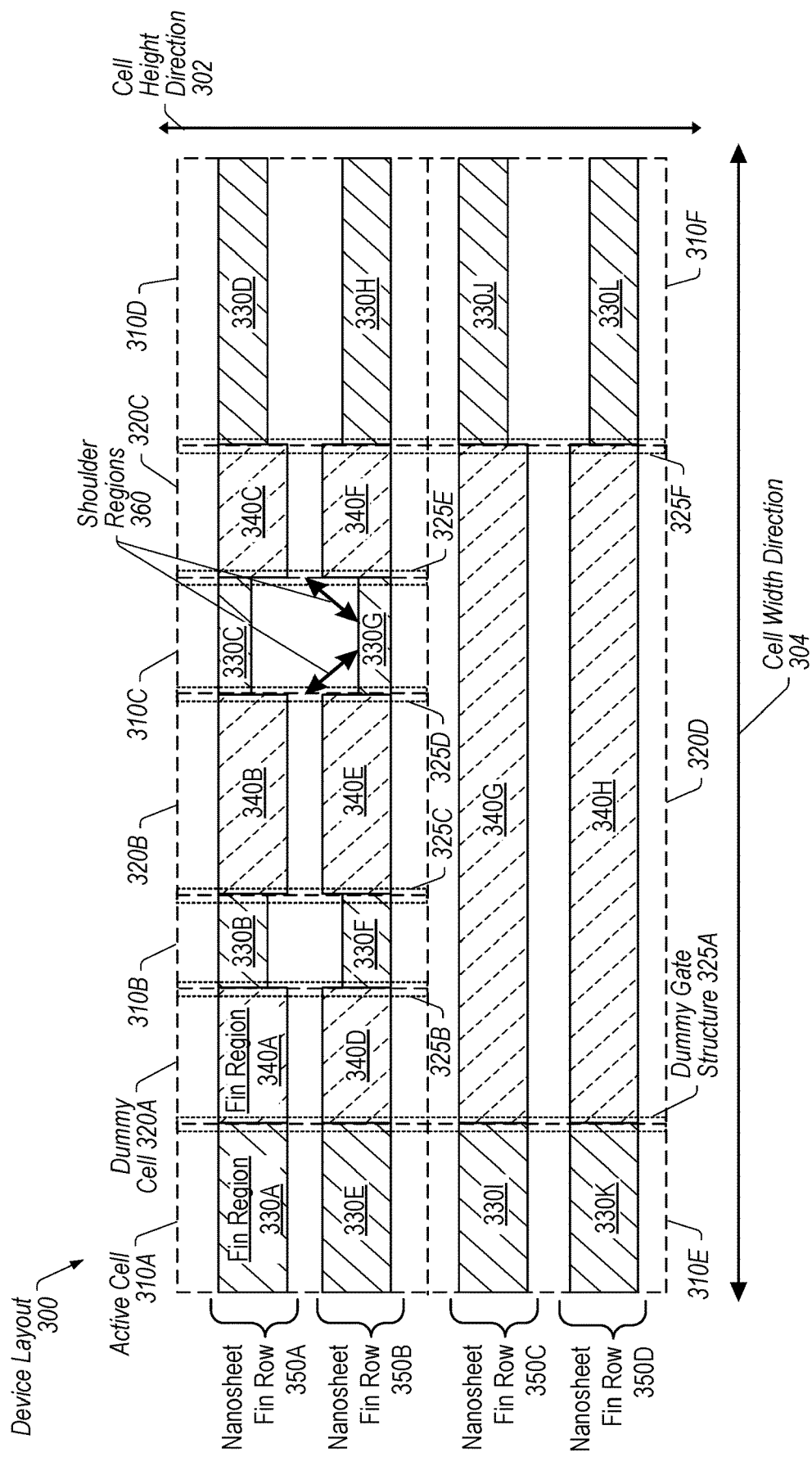
FIG. 3 depicts a top plan view representation of an example layout for a transistor device having multiple active and dummy cells with nanosheet fin regions, according to some embodiments.

FIG. 3 depicts a top plan view representation of an example layout for a transistor device having multiple active and dummy cells with nanosheet fin regions, according to some embodiments. The transistor device layout 300 has cell height direction 302 (vertical in the drawing) and cell width direction 304 (horizontal in the drawing). The device layout 300 includes active cells 310 and dummy cells 320. Active cells 310 may be, for instance, cells in device that are actively involved in the processing of signals. For example, active cells 310 may have connections (e.g., power or signal connections) to one or more of gates within the cells.

Dummy cells 320 may be cells in device layout 300 that are not involved in the processing of signals. For example, dummy cells 320 may not have any connections to the gates within the cells. In various embodiments, dummy cells 320 may be referred to as inactive cells or filler cells. In certain embodiments, as shown in FIG. 3, dummy cells 320 are positioned between active cells 310 in cell width direction 304 to provide electrical isolation between the active cells. While dummy cells 320 may have channel regions, gate structures, or source/drain regions similar to active cells 310, there are no connections to the gate structures or the source/drain regions in the dummy cells for signal processing. In certain embodiments, dummy gate structures 325 are placed at borders between dummy cells 320 and active cells 310 in an implementation of a device based on device layout 300. Active gate structures may be located inside active cells 310 but are not shown in the drawings for simplicity.

In various embodiments, active cells 310 include active nanosheet fin regions 330 and dummy cells 320 include dummy nanosheet fin regions 340. Active nanosheet fin regions 330 and dummy nanosheet fin regions 340 may be formed of the same materials with the only differences between the nanosheet fin regions being whether connections are made to gates associated with the nanosheet fin regions (e.g., connections are made to gates associated with for active nanosheet fin regions). In certain embodiments, active nanosheet fin regions 330 and dummy nanosheet fin regions 340 are positioned along nanosheet fin rows 350, as shown in FIG. 3. Nanosheet fin rows 350 may include a continuous row of alternating active nanosheet fin regions 330 and dummy nanosheet fin regions 340. For example, the alternating active nanosheet fin regions 330 and dummy nanosheet fin regions 340 are adjacent each other along the length of the row in cell width direction 304 with the dummy nanosheet fin regions positioned between the active nanosheet fin regions.

In some embodiments, active cells 310 and dummy cells 320 include combinations of active nanosheet fin regions 330 and dummy nanosheet fin regions 340 from multiple nanosheet fin rows 350. For instance, active cells 310 and dummy cells 320 may be cells that include active nanosheet fin regions 330 and dummy nanosheet fin regions 340 in two nanosheet fin rows 350 in each cell. As an example, in the illustrated embodiment, active cells 310A-D and dummy cells 320A-C include active nanosheet fin regions 330 and dummy nanosheet fin regions 340 in both nanosheet fin row 350A and nanosheet fin row 350B while active cells 310E-F and dummy cell 320D include active nanosheet fin regions 330 and dummy nanosheet fin regions 340 in both nanosheet fin row 350C and nanosheet fin row 350D.

It should be noted that the number of rows of nanosheet fin regions 350 in active cells 310 or dummy cells 320 may vary in contemplated embodiments. For instance, embodiments may be contemplated where active cells 310 and dummy cells 320 include only one row nanosheet fin row 350 with active nanosheet fin regions 330 and dummy nanosheet fin regions 340. Additionally, embodiments may be contemplated where active cells 310 and dummy cells 320 include three or more nanosheet fin rows 350 with active nanosheet fin regions 330 and dummy nanosheet fin regions 340.

In the illustrated embodiment, device layout 300 includes six active cells 310 (e.g., active cells 310A-F) and four dummy cells 320 (e.g., dummy cells 320A-D) encompassing four nanosheet fin rows 350 distributed in cell height direction 302 (e.g., nanosheet fin rows 350A, 350B, 350C, 350D). As described above, each nanosheet fin row 350 includes an alternating combination of active nanosheet fin regions 330 and dummy nanosheet fin regions 340 in cell width direction 304. For example, nanosheet fin row 350A includes four active nanosheet fin regions 330A-D with three dummy nanosheet fin regions 340A-C separating (e.g., positioned between) the active nanosheet fin regions in cell width direction 304. Additionally, each active cell 310 and each dummy cell 320 includes two nanosheet fin rows 350.

Accordingly, active cell 310A includes both active nanosheet fin region 330A in nanosheet fin row 350A and active nanosheet fin 330E in nanosheet fin row 350B. Further, dummy cell 320A includes dummy nanosheet fin region 340A in nanosheet fin row 350A and dummy nanosheet fin 340D in nanosheet fin row 350B. Similarly, the remaining active cells 310B-F include two active nanosheet fin regions 330 from two different nanosheet fin rows 350 and the remaining dummy cells 320B-D include two dummy nanosheet fin regions 340 from two different nanosheet fin rows 350.

In various embodiments, dummy gate structures 325 are placed along the borders between active cells 310 and dummy cells 320 in implementation of a transistor device based on device layout 300. Dummy gate structures 325 may be gate structures that provide isolation between active cells 310 and dummy cells 320 and do not have any connections to the gate structures. For instance, dummy gate structures 325 may be isolation structures between active cells 310 and dummy cells 320. In the illustrated embodiment, dummy gate structures 325A-F are placed along the borders between active cells 310 and dummy cells 320. Dummy gate structures 325 may include various lengths in cell height direction 302 depending on device layout 300. In some embodiments, dummy gate structures 325A and 325F are dummy gate structures that extend multiple active cell 310 and dummy cell 320 borders in cell height direction 302 (e.g., dummy gate structure 325A extends along the border between both active cell 310A and dummy cell 320A and the border between active cell 310E and dummy cell 320D). Dummy gate structures 325B-325E are dummy gate structures for a single border between one active cell 310 and one dummy cell 320. For example, dummy gate structure 325B is positioned only along the border between active cell 310B and dummy cell 320A.

A feature available with the utilization of nanosheet fins in transistor devices is that the widths of nanosheet fin regions (note that the width of these regions is in cell height direction 302) and corresponding nanosheet fins in these regions may be varied between different cells in layouts of the devices in addition to varying the lengths of the nanosheet fin regions (note that the length of these regions is in cell width direction 304). For instance, as shown in FIG. 3, both widths and lengths of active nanosheet fin regions 330 are varied between different active cells 310 in the device layout 300. Variation of the widths and lengths of active nanosheet fin regions 330 may be designed to provide different operational properties for active cells 310.

Varying the widths of active nanosheet fin regions 330 may, however, present different problems or limitations during operation of device layout 300 as well as during the steps of manufacturing the device. In some variations, the widths of active nanosheet fin regions 330 may be different from the widths of neighboring dummy nanosheet fin regions. For instance, as shown in FIG. 3, active nanosheet fin region 330G in active cell 310C has a different width from neighboring dummy nanosheet fin regions 340E and 340F in dummy cell 320B and dummy cell 320C, respectively. This difference in widths generates shoulder regions 360 where there is a jog between the two different widths. These jogs may generate layout dependent effects (LDEs) where the performance of active cell 310C is affected by dummy cells 320B, 320C. For instance, the jogs in widths may generate mechanical stress that affects the source/drain regions of active cell 310C. This mechanical stress may translate to changes in electrical properties of active cell 310C such as the threshold voltage of transistors in the active cell. Changes in the electrical properties may affect the performance of the transistors. Additionally, larger jogs in widths may cause larger mechanical stresses and larger degradation in transistor performance.

A manufacturing issue with a device based on device layout 300 may be due to delays in time between different manufacturing process stages (e.g., steps) and limitations in available changes to the layout of the device depending on the stage in the manufacturing process. For instance, a first stage in a manufacturing process may be based on a DAPO ("device/active and polysilicon order") where all the active device regions (e.g., oxide diffusion regions) and the gate material (e.g., polysilicon) layers are taped out based on device layout 300. The process stage of forming the active regions and polysilicon layers may take on the order of a few weeks following the DAPO. The next stage may be to form metal connections and other connections to the active regions and polysilicon layers. Because of the delay between implementation of the DAPO and the next stage in the manufacturing process, there may be changes to any originally planned connections using an ECO ("engineering change order"). The ECO may, for example, change how the connections to the active regions and polysilicon layers are made. These changes, however, are not able to include any changes to the sizes of the active regions or polysilicon layers already taped out. For instance, the length or widths of nanosheet fin regions 330/340 cannot be altered and a physical size of a transistor cannot be changed by the ECO (e.g., to increase gain). Gain may only be increased through changes in the metal connection logic to the already taped out active regions to essentially increase the horizontal size of the transistor. Further, the drive of the transistor is fixed by the layout in the DAPO and is difficult to change through changes in connection logic.

The present disclosure recognizes that additional flexibility in the design and manufacturing of transistor devices with nanosheet fin regions may be enabled by changing locations of where steps in nanosheet fin region widths (e.g., jogs between different nanosheet fin region widths) are positioned in an initial layout for the device (e.g., the layout in the DAPO for the device). For instance, moving some of the steps/jogs between different nanosheet fin region widths into the interior of dummy cells in the layout may provide more flexibility in changing the design of the device through an ECO after implementation of the layout from the DAPO. Changes in the physical size of a transistor by the ECO may now be possible where previously they could not be achieved. Additionally, moving the steps/jogs between different nanosheet fin region widths into the interior of dummy cells may reduce performance degradation from LDEs during operation of the device as the number and size of shoulder regions with jogs between dummy cells and active cells may be reduced.

Certain embodiments disclosed herein have three broad elements: 1) a first active transistor cell including a first nanosheet fin region having a first width; 2) a second active transistor cell including a second nanosheet fin region having a second width different than the first width, and 3) a dummy transistor cell positioned between the first active transistor cell and the second active transistor cell where the dummy transistor cell includes a third nanosheet fin region with a first portion adjacent the first nanosheet fin region that has the first width and a second portion adjacent the second nanosheet fin region that has the second width. In various embodiments, the first and second active transistor cells are part of a plurality of active cells in the device and the first dummy transistor cell is one of a plurality of dummy transistor cells in the device. In certain embodiments, the dummy transistor cell is positioned between the first active transistor cell and the second active transistor cell in the cell width direction while widths of the nanosheet fin regions are in the cell height direction.

Various illustrations of embodiments with these broad elements are now described in the present disclosure. It should be noted that the illustrated embodiments of the present disclosure depict design templates for devices with various active and dummy cells with nanosheet fin regions. These design templates provide basic building blocks from which many different types of devices may be constructed based on connection schemes to the transistors in the design templates. For example, simple devices (such as inverters, NAND devices, multiplexers (MUXs)) as well as more complex devices (e.g., complex FETs) may be constructed based on the basic building blocks of the present disclosure.

Figure 4:
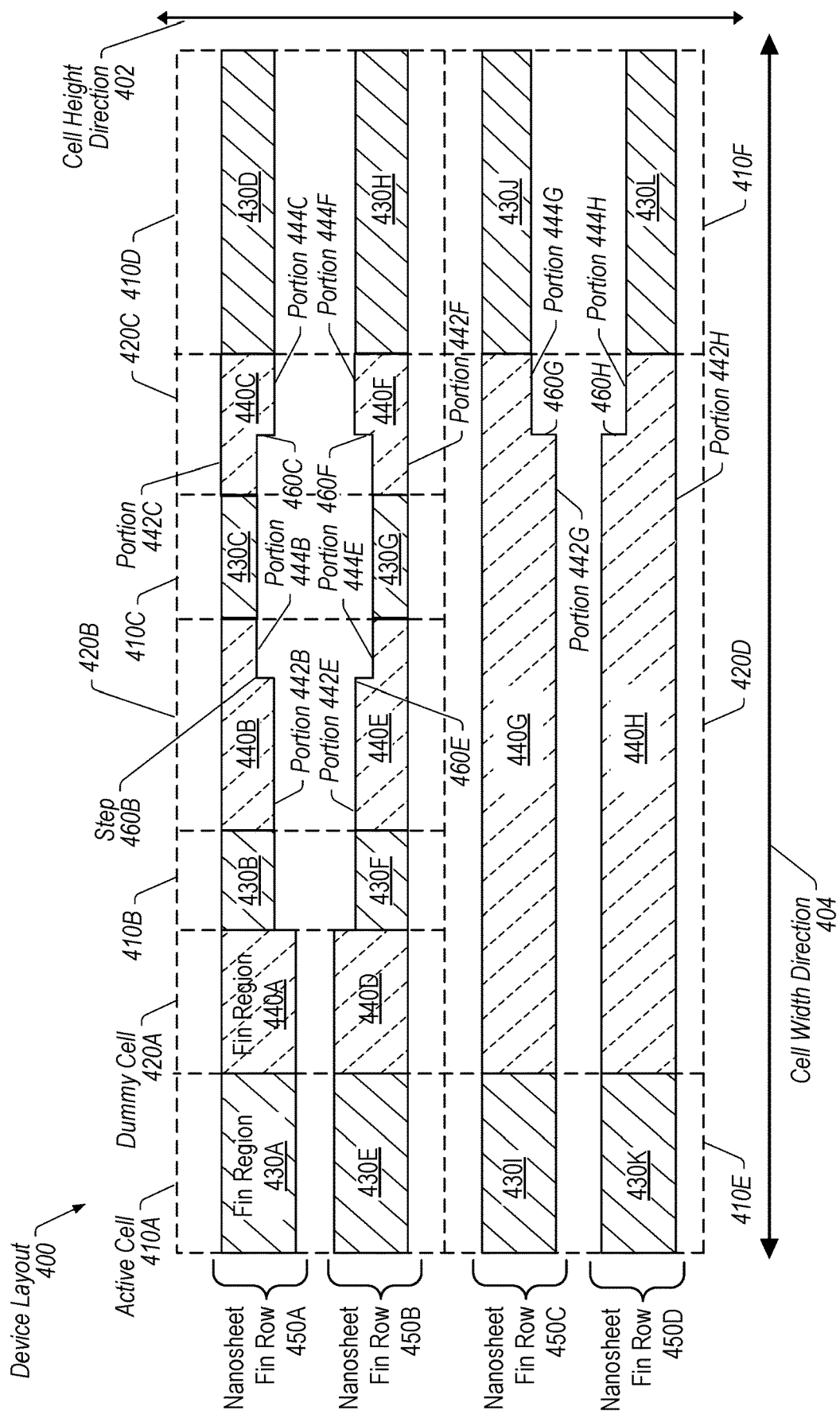
FIG. 4 depicts a top plan view representation of a contemplated layout for a transistor device having multiple active and dummy cells with some dummy nanosheet fin regions have different widths within the dummy cells, according to some embodiments.

FIG. 4 depicts a top plan view representation of a contemplated layout for a transistor device having multiple active and dummy cells with some dummy nanosheet fin regions have different widths within the dummy cells, according to some embodiments. The illustrated embodiment of device layout 400 includes six active cells 410 (e.g., active cells 410A-F) and four dummy cells 420 (e.g., dummy cells 420A-D) along with four nanosheet fin rows 450 (e.g., nanosheet fin rows 450A-D). Dummy cells 420 may be positioned between active cells 410 in cell width direction 404. For instance, as shown in FIG. 4, in cell width direction 404, dummy cell 420A is positioned between active cell 410A and active cell 410B, dummy cell 420B is positioned between active cell 410B and active cell 410C, dummy cell 420C is positioned between active cell 410C and active cell 410D, and dummy cell 420D is positioned between active cell 410E and active cell 410F.

In certain embodiments, active cells 410A-D and dummy cells 420A-C are positioned along nanosheet fin rows 450A and 450B and active cells 410E-F and dummy cell 420D are positioned along nanosheet fin rows 450C and 450D.

Accordingly, active cell 410A includes nanosheet fin regions 430A and 430E, active cell 410B includes nanosheet fin regions 430B and 430F, active cell 410C includes nanosheet fin regions 430C and 430G, active cell 410D includes nanosheet fin regions 430D and 430H, active cell 410E includes nanosheet fin regions 430I and 430K, and active cell 410F includes nanosheet fin regions 430J and 430L. Further, dummy cell 420A includes nanosheet fin regions 440A and 440D, dummy cell 420B includes nanosheet fin regions 440B and 440E, dummy cell 420C includes nanosheet fin regions 440C and 440F, and dummy cell 420D includes nanosheet fin regions 440G and 440H.

It should be understood that the number and arrangement of active cells 410, dummy cells 420, nanosheet fin regions 430, nanosheet fin regions 440, and nanosheet fin rows 450 shown in FIG. 4 are presented as one contemplated embodiment for a layout of a transistor device (e.g., device layout 400) and that additional embodiments of the layout for the transistor device may be contemplated within the scope of the present disclosure. For example, a contemplated transistor device layout may have different numbers or locations of active cells, dummy cells, nanosheet fin regions, or nanosheet fin rows that are determined based on design considerations for the transistor device. Changes in contemplated embodiments may additionally include the heights of active cells 410 and dummy cells 420 in cell height direction 402 and the lengths of active cells 410 and dummy cells 420 in cell width direction 404.

In certain embodiments, one or more dummy cells 420 include nanosheet fin regions 440 that have portions with different widths (note the widths of the nanosheet fin regions are in cell height direction 402, as shown in FIG. 4) inside the dummy cells. For instance, nanosheet fin regions 440 inside such dummy cells 420 may include a step change (e.g., jog) in width between a first portion and a second portion. The step change in width between the first portion and the second portion may be implemented as part of an initial design for device layout 400. In some embodiments, device layout 400 is implemented as the layout in the DAPO. In various embodiments, the step change is implemented for a nanosheet fin region inside a dummy cell that neighbors (e.g., is positioned between) two active cells with different nanosheet fin region widths. Accordingly, the step change may allow a width of the first portion to be matched to a width of a nanosheet fin region of a first active cell adjacent the first portion and a width of the second portion may be matched to a width of a nanosheet region of a second active cell adjacent the second portion.

In the illustrated embodiment of FIG. 4, dummy cell 420B, dummy cell 420C, and dummy cell 420D are examples of dummy cells that include portions with different nanosheet fin region widths. Dummy cell 420B includes nanosheet fin region 440B with first portion 442B and second portion 444B and nanosheet region 440E with first portion 442E and second portion 444E. A width of first portion 442B changes to a width of second portion 444B at step 460B and a width of first portion 442E changes to a width of second portion 444E at step 460E. Dummy cell 420C includes nanosheet fin region 440C with first portion 442C and second portion 444C and nanosheet fin region 440F with first portion 442F and second portion 444F. A width of first portion 442C changes to a width of second portion 444C at step 460C and a width of first portion 442F changes to a width of second portion 444F at step 460F. Dummy cell 420D includes nanosheet fin region 440G with first portion 442G and second portion 444G and nanosheet fin region 440H with first portion 442H and second portion 444H. A width of first portion 442G changes to a width of second portion 444G at step 460G and a width of first portion 442H changes to a width of second portion 444H at step 460H.

Turning first to dummy cell 420B, the width of first portion 442B matches a width of nanosheet fin region 430B in adjacent active cell 410B. The width of nanosheet fin region 440B changes at step 460B to the width of second portion 444B, which matches a width of nanosheet fin region 430C in active cell 410C. Additionally, the width of first portion 442E in dummy cell 420B matches a width of nanosheet fin region 430F in adjacent active cell 410B while the width of nanosheet fin region 440E changes at step 460E to the width of second portion 444E, which matches a width of nanosheet fin region 430G in active cell 410C.

Turning next to dummy cell 420C, the width of first portion 442C matches a width of nanosheet fin region 430C in adjacent active cell 410C. The width of nanosheet fin region 440C changes at step 460C to the width of second portion 444C, which matches a width of nanosheet fin region 430D in active cell 410D. Additionally, the width of first portion 442F in dummy cell 420C matches a width of nanosheet fin region 430G in adjacent active cell 410C while the width of nanosheet fin region 440F changes at step 460F to the width of second portion 444F, which matches a width of nanosheet fin region 430H in active cell 410D.

Turning finally to dummy cell 420D, the width of first portion 442G matches a width of nanosheet fin region 430I in adjacent active cell 410E. The width of nanosheet fin region 440G changes at step 460G to the width of second portion 444G, which matches a width of nanosheet fin region 430J in active cell 410F. Additionally, the width of first portion 442H in dummy cell 420D matches a width of nanosheet fin region 430K in adjacent active cell 410E while the width of nanosheet fin region 440H changes at step 460H to the width of second portion 444H, which matches a width of nanosheet fin region 430L in active cell 410F.

By placing the jogs in width (e.g., steps 460B-CC and steps 460E-H) inside the dummy cells (e.g., dummy cells 420B-D), the dummy cells have different fin region widths that match the widths of nanosheet fin regions in adjacent active cells on either side of the dummy cells (e.g., active cells 410B-F). Placing the jogs in width inside the dummy cells removes any shoulder regions along the borders between active cells and dummy cells. Thus, any transistor device formed based on device layout 400 shown in FIG. 4 may have reduced LDEs such as those generated by mechanical stress from jogs in width at the borders between active cells and dummy cells, as described above.

Figure 5:
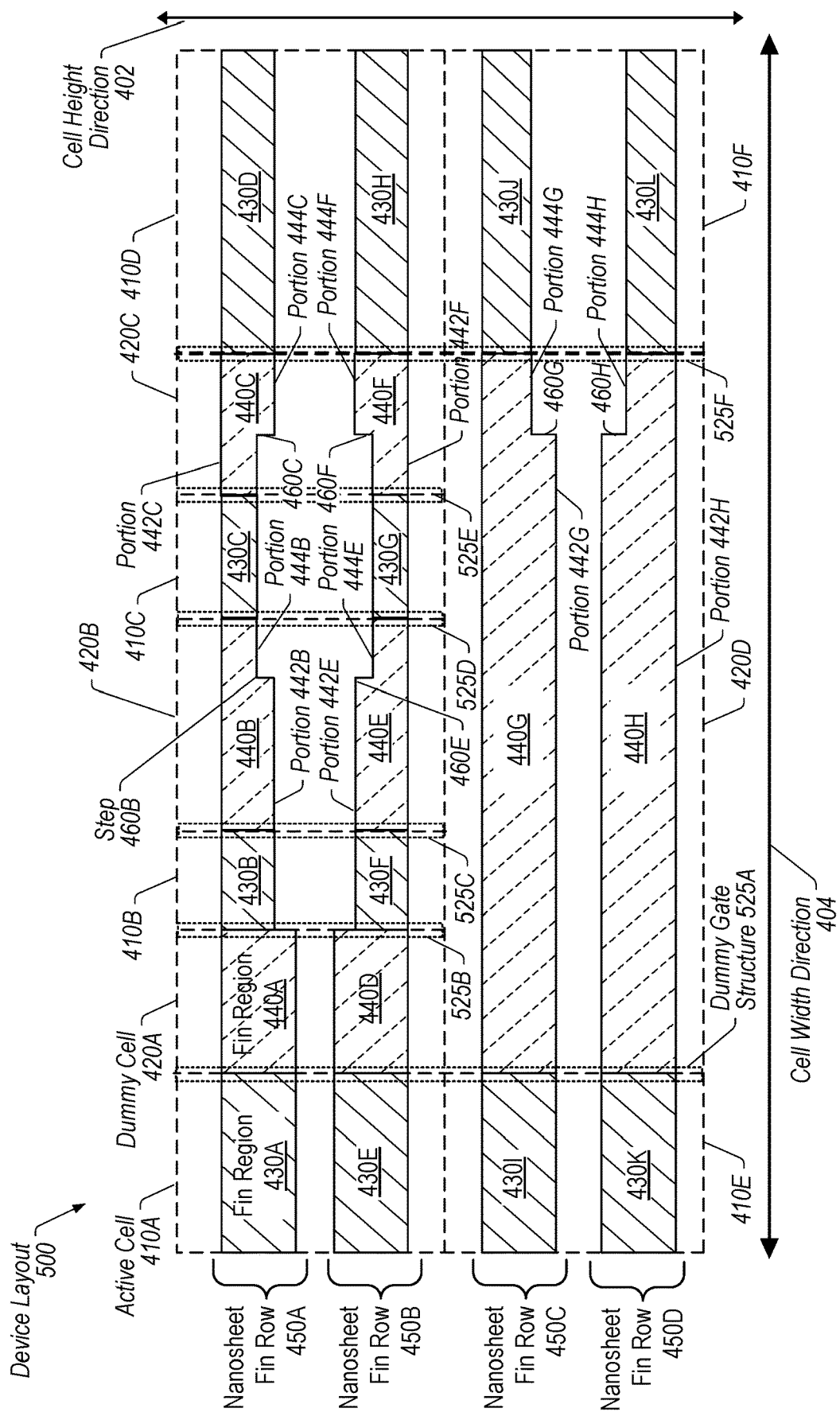
FIG. 5 depicts a top plan view representation of a contemplated transistor device layout with dummy gate structures defining borders between active cells and dummy cells that may be implemented based on the device layout in FIG. 4, according to some embodiments.

FIG. 5 depicts a top plan view representation of a contemplated transistor device layout with dummy gate structures defining borders between active cells and dummy cells that may be implemented based on device layout 400 in FIG. 4, according to some embodiments. In the illustrated embodiment, device layout 500 includes dummy gate structures 525 placed along the borders between active cells 410 and dummy cells 420 found in device layout 400 in FIG. 4. For example, dummy gate structure 525A is placed along the border between active cell 410A and dummy cell 420A, dummy gate structure 525B is placed along the border between dummy cell 420A and active cell 410B, dummy gate structure 525C is placed along the border between active cell 410B and dummy cell 420B, dummy gate structure 525D is placed along the border between dummy cell 420B and active cell 410C, dummy gate structure 525E is placed along the border between active cell 410C and dummy cell 420C, and dummy gate structure 525F is placed along the border between dummy cell 420C and active cell 410D.

In various embodiments, dummy gate structure 525A and dummy gate structure 525F are dummy gate structures that extend along continuous borders between multiple active cells and dummy cells. For example, dummy gate structure 525A may extend along the border between active cell 410E and dummy cell 420D that is continuous with the border between active cell 410A and dummy cell 420A. Dummy gate structure 525F may also extend along the border between dummy cell 420D and active cell 410F that is continuous with the border between active cell 410D and dummy cell 420C.

Device layout 500 is an example of a transistor device layout that may be implemented (and manufactured) without any changes in the sizes (e.g., widths or lengths) of active cells 410 and dummy cells 420 from device layout 400, shown in FIG. 4. For instance, device layout 400, shown in FIG. 4, may be a layout implemented in a DAPO that begins the manufacturing process and device layout 500, shown in FIG. 5, may be a layout implemented after an ECO is applied in the manufacturing process that adds dummy gate structures 525 (and other gate or metal connections) but where the ECO does not include any changes in sizes of the active cells and dummy cells. While there are no changes in the sizes (e.g., widths or lengths) of active cells 410 and dummy cells 420 from device layout 400 in device layout 500, dummy gate structures 525 are positioned along borders between the active cells and the dummy cells and the number and size of jogs (e.g., steps) in width are reduced (e.g., as compared to device layout 300) and thus any LDEs are reduced in a device manufactured according to device layout 500.

Turning back to FIG. 4, as device layout 400 includes jogs in width (e.g., steps 460) positioned inside dummy cells 420, an ECO may be implemented to change the physical sizes of active cells 410. Changing the physical size of active cells may change electrical properties of transistors in a transistor device manufactured based on device layout 400. In various embodiments, the physical sizes of active cells may be changed by changing the locations of dummy gate structures to change the lengths of active cells 410 (in cell width direction 404). For instance, because the jog in width (e.g., step) is inside the dummy cell neighboring the active cell and thus the width of the nanosheet fin region in the dummy cell from the border of the active cell to the step matches the width of the nanosheet fin region in the active cell, the length of the active cell may be increased by moving a dummy gate structure from its original intended location at the border between the active cell and the dummy cell in device layout 400 (as is done in device layout 500, shown in FIG. 5) to a location anywhere along the portion of the nanosheet fin region in the dummy cell that has the same width as the nanosheet fin region in the active cell (e.g., any location up to the step change in width in the dummy cell). Increasing the length of the active cell may increase the gain of the active cell. Additionally, locations and number of active gates in the active cell may be changed with the increase in length of the active cell. Yet further, the drive in the active cell may also be changed based on the increase in length of the active cell.

Figure 6:
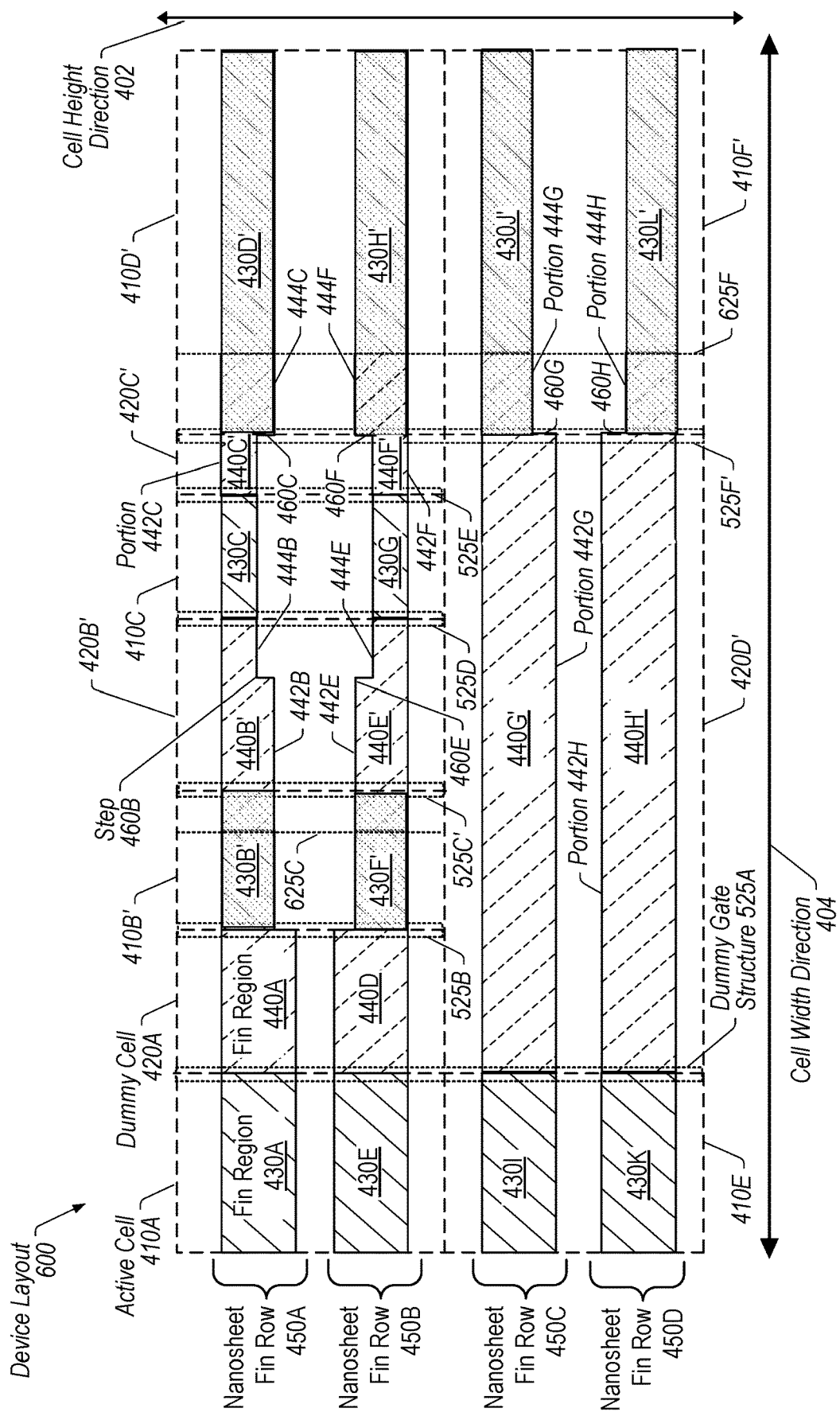
FIG. 6 depicts a top plan view representation of a contemplated transistor device layout with some dummy gate structures moved to increase active cell lengths originally based on the device layout in FIG. 4, according to some embodiments.

FIG. 6 depicts a top plan view representation of a contemplated transistor device layout with some dummy gate structures moved to increase active cell lengths originally based on device layout 400 in FIG. 4, according to some embodiments. In the illustrated embodiment of device layout 600, dummy gate structures 525A, 525B, 525D, and 525E are placed along the borders between active cells 410 and dummy cells 420 identically to device layout 500, shown in FIG. 5. Changes to the placement of dummy gate structure 525C and dummy gate structure 525F, however, are implemented in device layout 600 to increase the length of active cell 410B, active cell 410D, and active cell 410F in cell width direction 404.

In various embodiments, a dummy gate structure is moved to a location that overlies a portion of a nanosheet fin region in the dummy cell that has a width that matches a width of a nanosheet fin region in the neighboring active cell. Moving the dummy gate structure to the location that overlies such a portion of the nanosheet fin region in dummy cell displaces the dummy gate structure from its original intended location at the interface between the dummy cell and the active cell and redefines the length of the active cell based on the new location of the dummy gate structure over the portion of nanosheet fin region in the dummy cell. For instance, the length of the active cell now becomes a sum of the length of the nanosheet fin region in the original active cell and a length of the displacement of the dummy gate structure over the portion of the nanosheet fin region in the dummy cell from the original interface between the dummy cell and the active cell.

For example, turning first to the placement of dummy gate structure 525C between active cell 410B and dummy cell 420B, line 625C shows the original planned location of the dummy gate structure from device layout 400, shown in FIG. 4, that is implemented in device layout 500, shown in FIG. 5. In the illustrated embodiment of FIG. 6, dummy gate structure 525C' is the new displaced position of the dummy gate structure, which is to the right of the original location and now in the area of first portion 442B of nanosheet fin region 440B and first portion 442E of nanosheet fin region 440E. The new position of dummy gate structure 525C' may be implemented, for example, by an ECO that modifies the original layout based on the DAPO. As shown in the illustration, moving dummy gate structure 525C' to its new position increases the lengths (in cell width direction 404) and areas of nanosheet fin region 430B' and nanosheet fin region 430F' in active cell 410B' from their original areas with the new areas shown by the dot patterns. Additionally, increasing the areas of nanosheet fin region 430B' and nanosheet fin region 430F' correspondingly decreases the areas of nanosheet fin region 440B' and nanosheet fin region 440E' in dummy cell 420B'. The dot patterns now have new areas that are defined by the sum of the lengths of the original nanosheet fin regions in active cell 410B' and the portions of the original nanosheet fin regions in dummy cell 420B' now in the dot patterns. For example, a dot pattern may have an area defined by the sum of the length of nanosheet fin region 430B' and the portion of nanosheet fin region 440B' now in the dot pattern based on the displaced position of dummy gate structure 525C.

It should be noted that dummy gate structure 525C' may be moved to the right from its original intended location all the way to the positions of step 460B and step 460E in dummy cell 420B'. In the illustrated embodiment, however, dummy gate structure 525C' is moved only partially towards the positions of step 460B and step 460E and some parts of first portion 442B and first portion 442E remain in dummy cell 420B'. Maintaining some parts of first portion 442B and first portion 442E inside dummy cell 420B' maintains steps 460B and 460E in the dummy cell. Maintaining the steps (e.g., jogs in width) inside dummy cell 420B' may inhibit LDE between active cell 410B' and the dummy cell as there is no shoulder region between the cells that cause mechanical stresses that may translate to changes in electrical properties of the active cell.

In some embodiments, however, the position of a dummy gate structure may be moved to take up the entirety of portions of nanosheet fin regions inside a dummy cell that have the same width as the nanosheet fin regions inside a neighboring active cell. For instance, turning to the placement of dummy gate structure 525F along the border that extends both between active cell 410D and dummy cell 420C and active cell 410F and dummy cell 420D, line 625F shows the original planned location of the dummy gate structure from device layout 400, shown in FIG. 4, that is implemented in device layout 500, shown in FIG. 5. In the illustrated embodiment of FIG. 6, dummy gate structure 525F' is the new position of the dummy gate structure, which may be implemented, for example, by an ECO, as described above. As shown in the illustration, moving dummy gate structure 525F' to its new position increases the lengths and areas of nanosheet fin region 430D' and nanosheet fin region 430H' in active cell 410D' from their original areas with the new areas shown by the dot patterns. Additionally, moving dummy gate structure 525F' to its new position increases the lengths (in cell width direction 404) and areas of nanosheet fin region 430J' and nanosheet fin region 430L' in active cell 410F' from their original areas with the new areas shown by the dot patterns. The areas of nanosheet fin region 440C' and nanosheet fin region 440F' in dummy cell 420C along with the areas of nanosheet fin region 440G' and nanosheet fin region 440H' in dummy cell 420D' decrease corresponding to the increase in areas of the active cells' nanosheet fin regions.

As shown in FIG. 6, dummy gate structure 525F' is moved to the locations of steps 460C, 460F, 460G, 460H. Accordingly, the areas of active cells 410D' and 410F' are increased to their maximum possible area based on the originally planned layout of the device in device layout 400, shown in FIG. 4. It should be noted that increasing the areas of the active cells to their maximum sizes allowed by the originally planned layout does create shoulder regions between active cell 410D' and dummy cell 420C' and between active cell 410F' and dummy cell 420D'. Nevertheless, the size of the jogs in width at these shoulder regions may be small to reduce LDEs in the device. Additionally, the increase in area of the active cells may reduce any mechanical stresses caused by the neighboring dummy cells, also reducing the potential of LDEs in the device.

As described above, creating a device layout with jogs in widths of nanosheet fin regions (e.g., steps that change the widths of the nanosheet fin regions) to inside dummy cells in the device layout, as shown in FIGS. 4-6, provides various advantages over previous device layouts where jogs in width are fixed at the borders between active cells and dummy cells, as shown in FIG. 3. For instance, moving the jogs in width inside the dummy cells reduces the potential for degradation of performance of the device due to mechanical stresses that can affect the source/drain regions in the active cells and translate to changes in electrical properties of the active cells. Additionally, moving the jogs in width to inside the dummy cells allows for changes to be made to the physical size (e.g., lengths and areas) of active cells after the device has undergone DAPO processing. For example, an ECO may be implemented after DAPO processing that changes the locations of dummy gate structures to take advantage of the locations of the steps inside the dummy cells to increase the lengths and areas of active cells. The change in physical size of the active cells by the ECO enables the previously unavailable capability to change both the gain and drive of transistors in the nanosheet fin device according to the ECO.

Example Computer System

Figure 7:
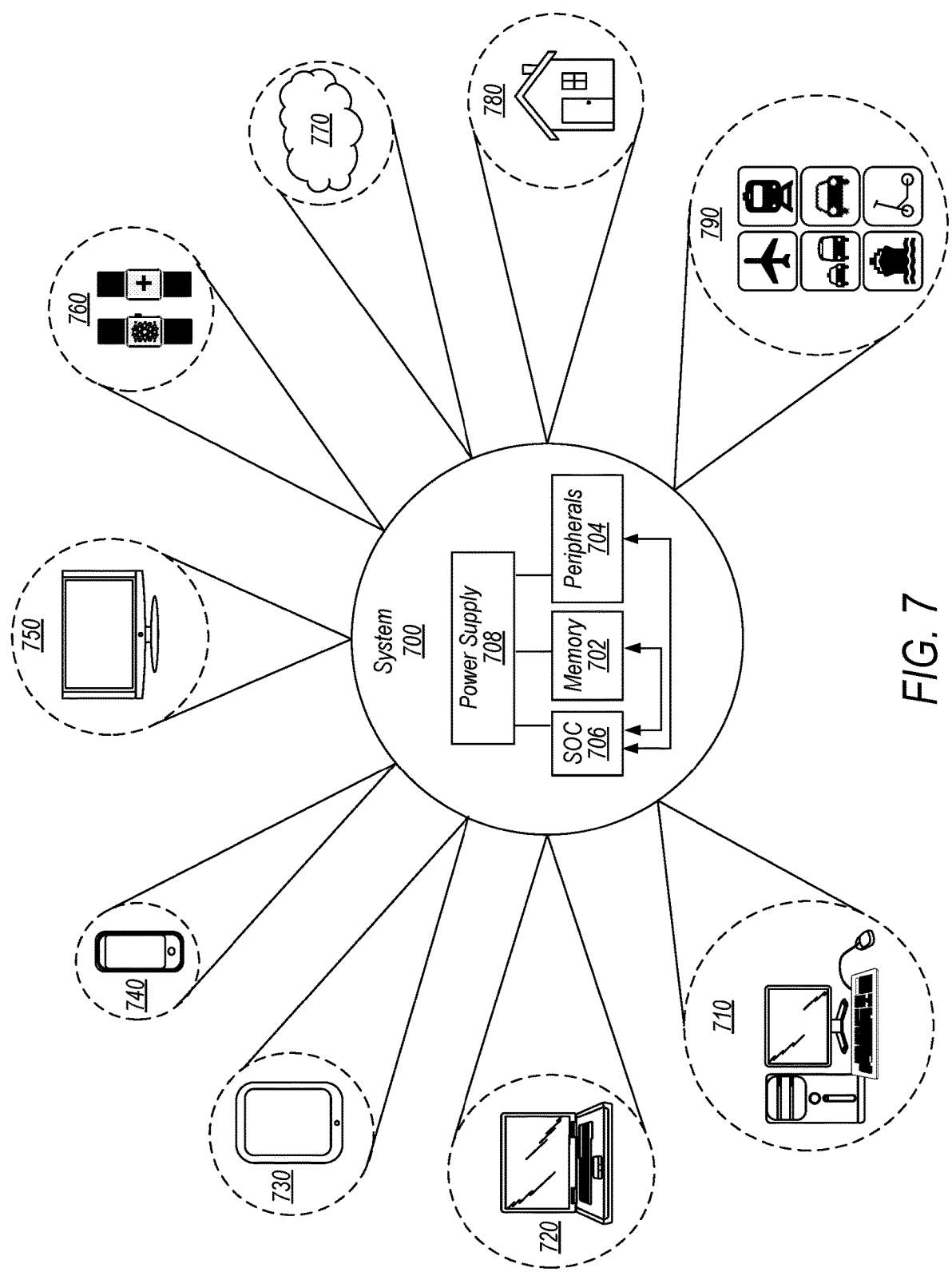
FIG. 7 is a block diagram of one embodiment of an example system.

Turning next to FIG. 7, a block diagram of one embodiment of a system 700 is shown that may incorporate and/or otherwise utilize the methods and mechanisms described herein. In the illustrated embodiment, the system 700 includes at least one instance of a system on chip (SoC) 706 which may include multiple types of processing units, such as a central processing unit (CPU), a graphics processing unit (GPU), or otherwise, a communication fabric, and interfaces to memories and input/output devices. In some embodiments, one or more processors in SoC 706 includes multiple execution lanes and an instruction issue queue. In various embodiments, SoC 706 is coupled to external memory 702, peripherals 704, and power supply 708.

A power supply 708 is also provided which supplies the supply voltages to SoC 706 as well as one or more supply voltages to the memory 702 and/or the peripherals 704. In various embodiments, power supply 708 represents a battery (e.g., a rechargeable battery in a smart phone, laptop or tablet computer, or other device). In some embodiments, more than one instance of SoC 706 is included (and more than one external memory 702 is included as well).

The memory 702 is any type of memory, such as dynamic random access memory (DRAM), synchronous DRAM (SDRAM), double data rate (DDR, DDR2, DDR3, etc.) SDRAM (including mobile versions of the SDRAMs such as mDDR3, etc., and/or low power versions of the SDRAMs such as LPDDR2, etc.), RAMBUS DRAM (RDRAM), static RAM (SRAM), etc. One or more memory devices are coupled onto a circuit board to form memory modules such as single inline memory modules (SIMMs), dual inline memory modules (DIMMs), etc. Alternatively, the devices are mounted with a SoC or an integrated circuit in a chip-on-chip configuration, a package-on-package configuration, or a multi-chip module configuration.

The peripherals 704 include any desired circuitry, depending on the type of system 700. For example, in one embodiment, peripherals 704 includes devices for various types of wireless communication, such as Wi-Fi, Bluetooth, cellular, global positioning system, etc. In some embodiments, the peripherals 704 also include additional storage, including RAM storage, solid state storage, or disk storage. The peripherals 704 include user interface devices such as a display screen, including touch display screens or multi-touch display screens, keyboard or other input devices, microphones, speakers, etc.

As illustrated, system 700 is shown to have application in a wide range of areas. For example, system 700 may be utilized as part of the chips, circuitry, components, etc., of a desktop computer 710, laptop computer 720, tablet computer 730, cellular or mobile phone 740, or television 750 (or set-top box coupled to a television). Also illustrated is a smartwatch and health monitoring device 760. In some embodiments, smartwatch may include a variety of general-purpose computing related functions. For example, smartwatch may provide access to email, cellphone service, a user calendar, and so on. In various embodiments, a health monitoring device may be a dedicated medical device or otherwise include dedicated health related functionality. For example, a health monitoring device may monitor a user's vital signs, track proximity of a user to other users for the purpose of epidemiological social distancing, contact tracing, provide communication to an emergency service in the event of a health crisis, and so on. In various embodiments, the above-mentioned smartwatch may or may not include some or any health monitoring related functions. Other wearable devices are contemplated as well, such as devices worn around the neck, devices that are implantable in the human body, glasses designed to provide an augmented and/or virtual reality experience, and so on.

System 700 may further be used as part of a cloud-based service(s) 770. For example, the previously mentioned devices, and/or other devices, may access computing resources in the cloud (i.e., remotely located hardware and/or software resources). Still further, system 700 may be utilized in one or more devices of a home 780 other than those previously mentioned. For example, appliances within the home may monitor and detect conditions that warrant attention. For example, various devices within the home (e.g., a refrigerator, a cooling system, etc.) may monitor the status of the device and provide an alert to the homeowner (or, for example, a repair facility) should a particular event be detected. Alternatively, a thermostat may monitor the temperature in the home and may automate adjustments to a heating/cooling system based on a history of responses to various conditions by the homeowner. Also illustrated in FIG. 7 is the application of system 700 to various modes of transportation 790. For example, system 700 may be used in the control and/or entertainment systems of aircraft, trains, buses, cars for hire, private automobiles, waterborne vessels from private boats to cruise liners, scooters (for rent or owned), and so on. In various cases, system 700 may be used to provide automated guidance (e.g., self-driving vehicles), general systems control, and otherwise. These any many other embodiments are possible and are contemplated. It is noted that the devices and applications illustrated in FIG. 7 are illustrative only and are not intended to be limiting. Other devices are possible and are contemplated.

The present disclosure includes references to "an "embodiment" or groups of "embodiments" (e.g., "some embodiments" or "various embodiments"). Embodiments are different implementations or instances of the disclosed concepts. References to "an embodiment," "one embodiment," "a particular embodiment," and the like do not necessarily refer to the same embodiment. A large number of possible embodiments are contemplated, including those specifically disclosed, as well as modifications or alternatives that fall within the spirit or scope of the disclosure.

This disclosure may discuss potential advantages that may arise from the disclosed embodiments. Not all implementations of these embodiments will necessarily manifest any or all of the potential advantages. Whether an advantage is realized for a particular implementation depends on many factors, some of which are outside the scope of this disclosure. In fact, there are a number of reasons why an implementation that falls within the scope of the claims might not exhibit some or all of any disclosed advantages. For example, a particular implementation might include other circuitry outside the scope of the disclosure that, in conjunction with one of the disclosed embodiments, negates or diminishes one or more the disclosed advantages. Furthermore, suboptimal design execution of a particular implementation (e.g., implementation techniques or tools) could also negate or diminish disclosed advantages. Even assuming a skilled implementation, realization of advantages may still depend upon other factors such as the environmental circumstances in which the implementation is deployed. For example, inputs supplied to a particular implementation may prevent one or more problems addressed in this disclosure from arising on a particular occasion, with the result that the benefit of its solution may not be realized. Given the existence of possible factors external to this disclosure, it is expressly intended that any potential advantages described herein are not to be construed as claim limitations that must be met to demonstrate infringement. Rather, identification of such potential advantages is intended to illustrate the type(s) of improvement available to designers having the benefit of this disclosure. That such advantages are described permissively (e.g., stating that a particular advantage "may arise") is not intended to convey doubt about whether such advantages can in fact be realized, but rather to recognize the technical reality that realization of such advantages often depends on additional factors.

Unless stated otherwise, embodiments are non-limiting. That is, the disclosed embodiments are not intended to limit the scope of claims that are drafted based on this disclosure, even where only a single example is described with respect to a particular feature. The disclosed embodiments are intended to be illustrative rather than restrictive, absent any statements in the disclosure to the contrary. The application is thus intended to permit claims covering disclosed embodiments, as well as such alternatives, modifications, and equivalents that would be apparent to a person skilled in the art having the benefit of this disclosure.

For example, features in this application may be combined in any suitable manner. Accordingly, new claims may be formulated during prosecution of this application (or an application claiming priority thereto) to any such combination of features. In particular, with reference to the appended claims, features from dependent claims may be combined with those of other dependent claims where appropriate, including claims that depend from other independent claims. Similarly, features from respective independent claims may be combined where appropriate.

Accordingly, while the appended dependent claims may be drafted such that each depends on a single other claim, additional dependencies are also contemplated. Any combinations of features in the dependent that are consistent with this disclosure are contemplated and may be claimed in this or another application. In short, combinations are not limited to those specifically enumerated in the appended claims.

Where appropriate, it is also contemplated that claims drafted in one format or statutory type (e.g., apparatus) are intended to support corresponding claims of another format or statutory type (e.g., method).

Because this disclosure is a legal document, various terms and phrases may be subject to administrative and judicial interpretation. Public notice is hereby given that the following paragraphs, as well as definitions provided throughout the disclosure, are to be used in determining how to interpret claims that are drafted based on this disclosure.

References to a singular form of an item (i.e., a noun or noun phrase preceded by "a," "an," or "the") are, unless context clearly dictates otherwise, intended to mean "one or more." Reference to "an item" in a claim thus does not, without accompanying context, preclude additional instances of the item. A "plurality" of items refers to a set of two or more of the items.

The word "may" is used herein in a permissive sense (i.e., having the potential to, being able to) and not in a mandatory sense (i.e., must).

The terms "comprising" and "including," and forms thereof, are open-ended and mean "including, but not limited to."

When the term "or" is used in this disclosure with respect to a list of options, it will generally be understood to be used in the inclusive sense unless the context provides otherwise. Thus, a recitation of "x or y" is equivalent to "x or y, or both," and thus covers 1) x but not y, 2) y but not x, and 3) both x and y. On the other hand, a phrase such as "either x or y, but not both" makes clear that "or" is being used in the exclusive sense.

A recitation of "w, x, y, or z, or any combination thereof" or "at least one of . . . w, x, y, and z" is intended to cover all possibilities involving a single element up to the total number of elements in the set. For example, given the set [w, x, y, z], these phrasings cover any single element of the set (e.g., w but not x, y, or z), any two elements (e.g., w and x, but not y or z), any three elements (e.g., w, x, and y, but not z), and all four elements. The phrase "at least one of . . . w, x, y, and z" thus refers to at least one element of the set [w, x, y, z], thereby covering all possible combinations in this list of elements. This phrase is not to be interpreted to require that there is at least one instance of w, at least one instance of x, at least one instance of y, and at least one instance of z.

Various "labels" may precede nouns or noun phrases in this disclosure. Unless context provides otherwise, different labels used for a feature (e.g., "first circuit," "second circuit," "particular circuit," "given circuit," etc.) refer to different instances of the feature. Additionally, the labels "first," "second," and "third" when applied to a feature do not imply any type of ordering (e.g., spatial, temporal, logical, etc.), unless stated otherwise.

The phrase "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

The phrases "in response to" and "responsive to" describe one or more factors that trigger an effect. This phrase does not foreclose the possibility that additional factors may affect or otherwise trigger the effect, either jointly with the specified factors or independent from the specified factors. That is, an effect may be solely in response to those factors, or may be in response to the specified factors as well as other, unspecified factors. Consider the phrase "perform A in response to B." This phrase specifies that B is a factor that triggers the performance of A, or that triggers a particular result for A. This phrase does not foreclose that performing A may also be in response to some other factor, such as C. This phrase also does not foreclose that performing A may be jointly in response to B and C. This phrase is also intended to cover an embodiment in which A is performed solely in response to B. As used herein, the phrase "responsive to" is synonymous with the phrase "responsive at least in part to." Similarly, the phrase "in response to" is synonymous with the phrase "at least in part in response to."

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure (i.e., something physical). More specifically, this formulation is used to indicate that this structure is arranged to perform the one or more tasks during operation. A structure can be said to be "configured to" perform some task even if the structure is not currently being operated. Thus, an entity described or recited as being "configured to" perform some task refers to something physical, such as a device, circuit, a system having a processor unit and a memory storing program instructions executable to implement the task, etc. This phrase is not used herein to refer to something intangible.

In some cases, various units/circuits/components may be described herein as performing a set of task or operations. It is understood that those entities are "configured to" perform those tasks/operations, even if not specifically noted.

The term "configured to" is not intended to mean "configurable to." An unprogrammed FPGA, for example, would not be considered to be "configured to" perform a particular function. This unprogrammed FPGA may be "configurable to" perform that function, however. After appropriate programming, the FPGA may then be said to be "configured to" perform the particular function.

For purposes of United States patent applications based on this disclosure, reciting in a claim that a structure is "configured to" perform one or more tasks is expressly intended not to invoke 35 U.S.C. § 112(f) for that claim element. Should Applicant wish to invoke Section 112(f) during prosecution of a United States patent application based on this disclosure, it will recite claim elements using the "means for" [performing a function] construct.

Different "circuits" may be described in this disclosure. These circuits or "circuitry" constitute hardware that includes various types of circuit elements, such as combinatorial logic, clocked storage devices (e.g., flip-flops, registers, latches, etc.), finite state machines, memory (e.g., random-access memory, embedded dynamic random-access memory), programmable logic arrays, and so on. Circuitry may be custom designed, or taken from standard libraries. In various implementations, circuitry can, as appropriate, include digital components, analog components, or a combination of both, Certain types of circuits may be commonly referred to as "units" (e.g., a decode unit, an arithmetic logic unit (ALU), functional unit, memory management unit (MMU), etc.). Such units also refer to circuits or circuitry.

The disclosed circuits/units/components and other elements illustrated in the drawings and described herein thus include hardware elements such as those described in the preceding paragraph. In many instances, the internal arrangement of hardware elements within a particular circuit may be specified by describing the function of that circuit. For example, a particular "decode unit" may be described as performing the function of "processing an opcode of an instruction and routing that instruction to one or more of a plurality of functional units," which means that the decode unit is "configured to" perform this function. This specification of function is sufficient, to those skilled in the computer arts, to connote a set of possible structures for the circuit.

In various embodiments, as discussed in the preceding paragraph, circuits, units, and other elements defined by the functions or operations that they are configured to implement, The arrangement and such circuits/units/components with respect to each other and the manner in which they interact form a microarchitectural definition of the hardware that is ultimately manufactured in an integrated circuit or programmed into an FPGA to form a physical implementation of the microarchitectural definition. Thus, the microarchitectural definition is recognized by those of skill in the art as structure from which many physical implementations may be derived, all of which fall into the broader structure described by the microarchitectural definition. That is, a skilled artisan presented with the microarchitectural definition supplied in accordance with this disclosure may, without undue experimentation and with the application of ordinary skill, implement the structure by coding the description of the circuits/units/components in a hardware description language (HDL) such as Verilog or VHDL. The HDL description is often expressed in a fashion that may appear to be functional. But to those of skill in the art in this field, this HDL description is the manner that is used transform the structure of a circuit, unit, or component to the next level of implementational detail. Such an HDL description may take the form of behavioral code (which is typically not synthesizable), register transfer language (RTL) code (which, in contrast to behavioral code, is typically synthesizable), or structural code (e.g., a netlist specifying logic gates and their connectivity). The HDL description may subsequently be synthesized against a library of cells designed for a given integrated circuit fabrication technology, and may be modified for timing, power, and other reasons to result in a final design database that is transmitted to a foundry to generate masks and ultimately produce the integrated circuit. Some hardware circuits or portions thereof may also be custom-designed in a schematic editor and captured into the integrated circuit design along with synthesized circuitry. The integrated circuits may include transistors and other circuit elements (e.g., passive elements such as capacitors, resistors, inductors, etc.) and interconnect between the transistors and circuit elements. Some embodiments may implement multiple integrated circuits coupled together to implement the hardware circuits, and/or discrete elements may be used in some embodiments. Alternatively, the HDL design may be synthesized to a programmable logic array such as a field programmable gate array (FPGA) and may be implemented in the FPGA. This decoupling between the design of a group of circuits and the subsequent low-level implementation of these circuits commonly results in the scenario in which the circuit or logic designer never specifies a particular set of structures for the low-level implementation beyond a description of what the circuit is configured to do, as this process is performed at a different stage of the circuit implementation process.

The fact that many different low-level combinations of circuit elements may be used to implement the same specification of a circuit results in a large number of equivalent structures for that circuit. As noted, these low-level circuit implementations may vary according to changes in the fabrication technology, the foundry selected to manufacture the integrated circuit, the library of cells provided for a particular project, etc. In many cases, the choices made by different design tools or methodologies to produce these different implementations may be arbitrary.

Moreover, it is common for a single implementation of a particular functional specification of a circuit to include, for a given embodiment, a large number of devices (e.g., millions of transistors). Accordingly, the sheer volume of this information makes it impractical to provide a full recitation of the low-level structure used to implement a single embodiment, let alone the vast array of equivalent possible implementations. For this reason, the present disclosure describes structure of circuits using the functional shorthand commonly employed in the industry.

What is claimed is:

1. An integrated circuit device, comprising:
a substrate;
a plurality of active transistor cells having nanosheet fin regions with widths in a first direction of a horizontal dimension above the substrate and lengths in a second direction of the horizontal dimension, the second direction being perpendicular to the first direction, wherein the plurality of active transistor cells includes:
a first active transistor cell including a first nanosheet fin region having a first width; and
a second active transistor cell including a second nanosheet fin region having a second width different than the first width;
a plurality of dummy transistor cells having nanosheet fin regions with widths in the first direction and lengths in the second direction, wherein the plurality of dummy transistor cells includes:
a first dummy transistor cell positioned between the first active transistor cell and the second active transistor cell in the second direction, wherein the first dummy transistor cell includes a third nanosheet fin region with:
a first portion having a first interface with the first nanosheet fin region, the first portion having the first width; and
a second portion having a second interface with the second nanosheet fin region, the second portion having the second width;
a second dummy transistor cell positioned adjacent the first active transistor cell on an opposing side to the first dummy transistor cell in the second direction, wherein the second dummy transistor cell includes a fourth nanosheet fin region with a portion of the fourth nanosheet fin region interfacing the first nanosheet fin region and having the first width; and
an isolation structure between the first active transistor cell and the first dummy transistor cell, wherein the isolation structure extends lengthwise in the first direction over a part of the first portion of the third nanosheet fin region that is displaced in the second direction from the first interface.

2. The device of claim 1, further comprising:
a third active transistor cell positioned adjacent the second dummy transistor cell on an opposing side to the first active transistor cell in the second direction, wherein the third active transistor cell includes a fifth nanosheet fin region interfacing the fourth nanosheet fin region and having a third width.

3. The device of claim 1, further comprising a second isolation structure positioned along the second interface, the second isolation structure extending along the second interface in the first direction.

4. The device of claim 1, further comprising:
a fourth active transistor cell including a sixth nanosheet fin region having the first width, wherein the sixth nanosheet fin region is spaced apart from the first nanosheet fin region in the first direction, and wherein ends of the sixth nanosheet fin region in the second direction are aligned with ends of the first nanosheet fin region; and
a fifth active transistor cell including a seventh nanosheet fin region having the second width, wherein the seventh nanosheet fin region is spaced apart from the second nanosheet fin region in the first direction, and wherein ends of the seventh nanosheet fin region in the second direction are aligned with ends of the second nanosheet fin region.

5. The device of claim 4, further comprising:
a third dummy transistor cell positioned between the fourth active transistor cell and the fifth active transistor cell in the second direction, wherein the third dummy transistor cell includes an eighth nanosheet fin region with:
   a first portion having a third interface with the sixth nanosheet fin region, the first portion having the first width; and
   a second portion having a fourth interface with the seventh nanosheet fin region, the second portion having the second width.

6. The device of claim 5, wherein the isolation structure is further positioned between the fourth active transistor cell and the third dummy transistor cell with the isolation structure extending lengthwise in the first direction over a part of the first portion of the sixth nanosheet fin region that is displaced in the second direction from the third interface.

7. The device of claim 5, wherein the first portion of the eighth nanosheet fin region has ends in the second direction aligned with ends of the first portion of the third nanosheet fin region, and wherein the second portion of the eighth nanosheet fin region has ends in the second direction aligned with ends of the second portion of the third nanosheet fin region.

8. The device of claim 1, wherein the part of the first portion of the third nanosheet fin region under the isolation structure is at an interface between the first portion and the second portion of the third nanosheet fin region.

9. The device of claim 1, wherein the second active transistor cell includes at least one active gate structure having a portion overlying the second nanosheet fin region in a vertical dimension above the substrate.

10. An integrated circuit device, comprising:
a substrate;
a transistor region on the substrate having a width in a first direction in a horizontal dimension above the substrate and a length in a second direction in the horizontal dimension, the second direction being perpendicular to the first direction, wherein the transistor region includes:
   a nanosheet fin region extending a length in the second direction, wherein the nanosheet fin region includes:
      active portions having widths in the first direction and lengths in the second direction; and
      dummy portions having widths in the first direction and lengths in the second direction, wherein at least a first dummy portion is positioned between at least a first active portion and a second active portion in the second direction;
   wherein the first active portion has a first width and the second active portion has a second width; and
   wherein the first dummy portion includes a first part having the first width interfacing with the first active portion and a second part having the second width interfacing with the second active portion, the first dummy portion including a step between the first width and the second width in an interior of the first dummy portion; and
   an isolation structure defining a border between an active cell and a dummy cell in the transistor region, wherein the isolation structure extends lengthwise in the first direction over a portion of the first part of the first dummy portion that is displaced from an interface between the first part and the first active portion.

11. The device of claim 10, wherein the active cell has an active region that includes the first active portion and the portion of the first part of the first dummy portion up to the border defined by the isolation structure.

12. The device of claim 10, further comprising:
a second dummy portion interfacing the first active portion on an opposing side to the first dummy portion in the second direction, wherein a part of the second dummy portion interfacing the first active portion has the first width; and
a third active portion interfacing the second dummy portion on an opposing side to the first active portion in the second direction, wherein the third active portion has a third width.

13. The device of claim 12, wherein the third width is approximately the same as the second width.

14. The device of claim 10, further comprising an active gate structure positioned in the second active portion.

15. The device of claim 10, wherein the isolation structure defining the border between the active cell and the dummy cell in the transistor region is positioned lengthwise along an interface between the first part and the second part of the first dummy portion.

16. The device of claim 10, wherein the first part and the second part have a first length and a second length, respectively, that combine to define an overall length of the first dummy portion in the second direction.

17. An integrated circuit device, comprising:
a substrate;
a plurality of active transistor cells having nanosheet fin regions with widths in a first direction of a horizontal dimension above the substrate and lengths in a second direction of the horizontal dimension, the second direction being perpendicular to the first direction, wherein the plurality of active transistor cells includes:
   a first active transistor cell including a first nanosheet fin region having a first width; and
   a second active transistor cell including a second nanosheet fin region having a second width different than the first width;
a plurality of dummy transistor cells having nanosheet fin regions with widths in the first direction and lengths in the second direction, wherein the plurality of dummy transistor cells includes:
   a first dummy transistor cell positioned between the first active transistor cell and the second active transistor cell in the second direction, wherein the first dummy transistor cell includes a third nanosheet fin region with:
      a first portion adjacent the first nanosheet fin region, the first portion having the first width; and
      a second portion adjacent the second nanosheet fin region, the second portion having the second width, wherein the third nanosheet fin region includes a step between the first width and the second width defining a transition between the first portion and the second portion in an interior of the first dummy transistor cell; and
a dummy gate structure extending lengthwise in the first direction, wherein the dummy gate structure is positioned at a location overlying the first portion of the third nanosheet fin region in a vertical dimension that is displaced in the second direction from an interface of the first portion of the third nanosheet fin region and the first nanosheet fin region, and wherein the location of the dummy gate structure in the second direction defines a length of the first active transistor cell in the second direction to be a sum of a length of the first nanosheet fin region and a length of the displacement of the dummy gate structure from the interface in the second direction.

18. The device of claim 17, wherein the dummy gate structure defines a border between the first active transistor cell and the dummy transistor cell.

19. The device of claim 18, wherein at least some part of the first portion of the third nanosheet fin region remains in the dummy transistor cell.

20. The device of claim 18, wherein an entirety of the first portion of the third nanosheet fin region is in the first active transistor cell.

\* \* \* \* \*